United States Patent
Ota et al.

(10) Patent No.: US 10,665,375 B2
(45) Date of Patent: May 26, 2020

(54) SPIN CURRENT MAGNETIZATION ROTATIONAL ELEMENT, SPIN-ORBIT-TORQUE MAGNETORESISTANCE EFFECT ELEMENT, MAGNETIC MEMORY, AND HIGH-FREQUENCY MAGNETIC ELEMENT

(71) Applicant: TDK CORPORATION, Tokyo (JP)

(72) Inventors: Minoru Ota, Tokyo (JP); Tomoyuki Sasaki, Tokyo (JP); Hirokazu Takahashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/116,547

(22) Filed: Aug. 29, 2018

(65) Prior Publication Data

US 2019/0088395 A1 Mar. 21, 2019

(30) Foreign Application Priority Data

Sep. 1, 2017 (JP) .................................. 2017-168936

(51) Int. Cl.
  *G11C 11/16* (2006.01)
  *G11C 11/18* (2006.01)
  (Continued)

(52) U.S. Cl.
  CPC ........ *H01F 10/3286* (2013.01); *G11C 11/161* (2013.01); *G11C 11/1675* (2013.01); *G11C 11/18* (2013.01); *H01F 10/123* (2013.01); *H01F 10/324* (2013.01); *H01F 10/329* (2013.01); *H01F 10/3254* (2013.01); *H01L 43/06* (2013.01); *H01L 43/08* (2013.01)

(58) Field of Classification Search
  CPC ............... H01F 10/3286; H01F 10/123; H01F 10/3254; G11C 11/161; G11C 11/1675; G11C 11/18; H01L 43/08
  See application file for complete search history.

(56) References Cited

U.S. PATENT DOCUMENTS 8,350,347 B2    1/2013  Gaudin et al.
10,355,202 B2 * 7/2019  Sasaki
(Continued)

FOREIGN PATENT DOCUMENTS

WO    2016/021468 A1    2/2016

OTHER PUBLICATIONS

Miron et al.; "Perpendicular switching of a single ferromagnetic layer induced by in-plane current injection;" Nature; 2011; pp. 189-194; vol. 476.

(Continued)

*Primary Examiner* — Gene N Auduong
(74) *Attorney, Agent, or Firm* — Oliff PLC

(57) ABSTRACT

The present disclosure is directed to a spin current magnetization rotational element, a spin-orbit-torque magnetoresistance effect element, a magnetic memory, and a high-frequency magnetic element which can efficiently generate a pure spin current and reduce a reversal current density. The spin current magnetization rotational element includes: a spin-orbit torque wiring extending in a first direction; and a first ferromagnetic layer laminated in a second direction which intersects the first direction, wherein the spin-orbit torque wiring includes at least one rare gas element of Ar, Kr, and Xe.

16 Claims, 6 Drawing Sheets

(51) Int. Cl.
  *H01F 10/32* (2006.01)
  *H01L 43/08* (2006.01)
  *H01F 10/12* (2006.01)
  *H01L 43/06* (2006.01)

(56) References Cited

U.S. PATENT DOCUMENTS

| | | | | |
|---|---|---|---|---|
| 2011/0293967 | A1* | 12/2011 | Zhang | G11B 5/7379 428/827 |
| 2015/0348606 | A1 | 12/2015 | Buhrman et al. | |
| 2016/0247550 | A1* | 8/2016 | Fukami | H01L 43/08 |
| 2017/0222135 | A1 | 8/2017 | Fukami et al. | |
| 2019/0088711 | A1* | 3/2019 | Shiokawa | H01L 27/222 |

OTHER PUBLICATIONS

Kato et al.; "Observation of the Spin Hall Effect in Semiconductors;" Science; 2004; 1910-1913; vol. 306.

Liu et al.; "Spin torque switching with the giant spin Hall effect of tantalum;" Science; 2012; pp. 1-13; vol. 336; and pp. 1-12; vol. 555.

Liu et al.; "Current-Induced Switching of Perpendicularly Magnetized Magnetic Layers Using Spin Torque from the Spin Hall Effect;" Physics Review Letters; 2012; pp. 096602-1-096602-5; vol. 109.

Lee et al.; Threshold current for switching of a perpendicular magnetic layer induced by spin Hall effect; Applied Physics Letters; 2013; vol. 102.

Lee et al.; "Thermally activated switching of perpendicular magnet by spin-orbit spin torque;" Applied Physics Letters; 2014; vol. 104.

Fukami et al.; "Magnetization switching by spin-orbit torque in an antiferromagnet-ferromagnet bilayer system;" Nature Materials; 2016; pp. 535-542; vol. 15.

Fukami et al.; "A spin-orbit torque switching scheme with collinear magnetic easy axis and current configuration;" Nature Nanotechnology; 2016; pp. 1-6; vol. 11.

Takahashi et al.; "Spin injection and detection in magnetic nanostructures;" Physical Review B; 2003; pp. 052409-1-052409-4; vol. 67.

Seo et al.; "Area-Efficient SOT-MRAM With a Schottky Diode;" IEEE Electron Device Letters; 2016; pp. 982-985; vol. 37, No. 8.

Zhang et al.; "Spin Hall Effects in Metallic Antiferromagnets;" Physical Review Letters; 2014; pp. 196602-1-19602-6; vol. 113.

* cited by examiner

SPIN CURRENT MAGNETIZATION ROTATIONAL ELEMENT, SPIN-ORBIT-TORQUE MAGNETORESISTANCE EFFECT ELEMENT, MAGNETIC MEMORY, AND HIGH-FREQUENCY MAGNETIC ELEMENT

TECHNICAL FIELD

The present disclosure relates to a spin current magnetization rotational element, a spin-orbit-torque magnetoresistance effect element, a magnetic memory, and a high-frequency magnetic element.

Priority is claimed on Japanese Patent Application No. 2017-168936, filed on Sep. 1, 2017, the contents of which are incorporated herein by reference.

BACKGROUND ART

A giant magnetoresistance (GMR) element constituted of a multilayer film having a ferromagnetic layer and a nonmagnetic layer, and a tunneling magnetoresistance (TMR) element using an insulating layer (tunnel barrier layer, barrier layer) as a nonmagnetic layer are known as a magnetoresistance effect element. Generally, a TMR element has high element resistance and a high magnetoresistance (MR) ratio compared to a GMR element. Therefore, the TMR element has attracted attention as an element for a magnetic sensor, a high-frequency component, a magnetic head, and a nonvolatile magnetic random-access memory (MRAM).

The MRAM reads and writes data utilizing the characteristic that the element resistance of a TMR element changes when orientations of magnetizations of two ferromagnetic layers sandwiching an insulating layer therebetween change. As a writing method of an MRAM, a writing method utilizing a magnetic field made by a current (magnetization rotation), and a writing method utilizing a spin-transfer torque (STT) caused when a current flows in a lamination direction of a magnetoresistance effect element (magnetization rotation) are known.

A magnetization rotation of a TMR element using an STT is efficient when considered from the viewpoint of efficiency in energy. However, the rotational current density for a magnetization rotation is high. It is desirable that the rotational current density be low from the viewpoint of extending the life of a TMR element. The same applies to a GMR element as well.

Recently, a magnetization rotation utilizing a pure spin current generated through spin orbit interaction by a mechanism different from an STT (for example, Non-Patent Document 1 in I. M. Miron, K. Garello, G. Gaudin, P J. Zermatten, M V. Costache, S. Auffret, S. Bandiera, B. Rodmacq, A. Schuhl, and P. Gambardella, Nature, 476, 189 (2011)). This mechanism has not been sufficiently elucidated. However, it is assumed that a pure spin current caused due to the spin orbit interaction or the Rashba effect at the interface between different materials induces a spin-orbit torque (SOT), and a magnetization rotation is caused due to the SOT. A pure spin current is generated when the same number of electrons of an upward spin and electrons of a downward spin flow in orientations opposite to each other, and a flow of electric charge is offset. Therefore, a current flowing in a magnetoresistance effect element is zero, and an extended life for the magnetoresistance effect element is expected.

SUMMARY

However, it was reported in Non-Patent Document 1 in I. M. Miron, K. Garello, G. Gaudin, P J. Zermatten, M V. Costache, S. Auffret, S. Bandiera, B. Rodmacq, A. Schuhl, and P. Gambardella, Nature, 476, 189 (2011) that a reversal current density due to a spin-orbit torque (SOT) in an element structure at present is substantially the same as a reversal current density due to a spin transfer torque (STD. A current flow which generates a pure spin current does not cause any damage to a magnetoresistance effect element but a reversal current density is required to be reduced in terms of drive efficiency. In order to reduce a reversal current density, it is necessary to generate a pure spin current more efficiently.

The present disclosure was made in terms of the above-described circumstances, and an object of the present disclosure is to provide a spin current magnetization rotational element, a spin-orbit-torque magnetoresistance effect element, a magnetic memory, and a high-frequency magnetic element which can efficiently generate a pure spin current and reduce a reversal current density.

In order to achieve the above-described object, the present disclosure provides the following means.

(1) A spin current magnetization rotational element according to a first aspect includes: a spin-orbit torque wiring extending in a first direction; and a first ferromagnetic layer laminated in a second direction which intersects the first direction, wherein the spin-orbit torque wiring includes at least one rare gas element of Ar, Kr, and Xe.

(2) In the spin current magnetization rotational element according to the aspect, a molar ratio of the rare gas element may be 0.005% or more and 2.00% or less of a total molar ratio of elements constituting the spin-orbit torque wiring.

(3) In the spin current magnetization rotational element according to the aspect, the spin-orbit torque wiring may be constituted of a plurality of layers laminated in the second direction, and a concentration of the rare gas element may be the highest at any one face among interfaces and surfaces of the plurality of layers.

(4) In the spin current magnetization rotational element according to the aspect, the spin-orbit torque wiring may be constituted of the plurality of layers laminated in the second direction, the concentration of the rare gas element at a first interface closest to the first ferromagnetic layer among the interfaces of the plurality of layers may be higher than the concentration of the rare gas element in a portion closer to the first ferromagnetic layer than the first interface in the spin-orbit torque wiring, and a distance between the first interface and the first ferromagnetic layer in the second direction may be shorter than a spin diffusion length of a material formed between the first ferromagnetic layer and the first interface.

(5) In the spin current magnetization rotational element according to the aspect, the spin-orbit torque wiring may be constituted of a plurality of layers laminated in the second direction, and a first additional layer constituting the spin-orbit torque wiring may be provided between a high-concentration layer in which a concentration of the rare gas element is the highest among the plurality of layers and the first ferromagnetic layer.

(6) In the spin current magnetization rotational element according to the aspect, a distance between the first ferromagnetic layer and the high-concentration layer in the second direction may be shorter than a spin diffusion length of a material formed between the first ferromagnetic layer and the high-concentration layer.

(7). In the spin current magnetization rotational element according to the aspect, a second additional layer constituting the spin-orbit torque wiring may be provided on a side of the high-concentration layer opposite to the first ferromagnetic layer.

(8) In the spin current magnetization rotational element according to the aspect, the spin-orbit torque wiring may be constituted of a plurality of layers laminated in the second direction, and a high-concentration layer in which a concentration of the rare gas element is the highest among the plurality of layers may be located closest to the first ferromagnetic layer.

(9) In the spin current magnetization rotational element according to the aspect, the spin-orbit torque wiring may be constituted of a plurality of layers laminated in the second direction, and spin resistance of a first layer located on the first ferromagnetic layer side in two arbitrary layers among the plurality of layers may be smaller than spin resistance of a second layer located away from the first ferromagnetic layer.

(10) According to a second aspect, a spin-orbit-torque magnetoresistance effect element is provided, including the spin current magnetization rotational element according to the aspect described above, a nonmagnetic layer which is laminated on a surface on a side opposite to a surface in contact with a spin-orbit torque wiring in a first ferromagnetic layer, and a second ferromagnetic layer, the nonmagnetic layer being sandwiched between the second ferromagnetic layer and the first ferromagnetic layer.

(11) According to a third aspect, a magnetic memory is provided, including a plurality of spin-orbit-torque magnetoresistance effect elements according to the second aspect.

(12) A high-frequency magnetic element according to a fourth aspect includes: the spin-orbit-torque magnetoresistance effect element according to the second aspect.

A spin current magnetization rotational element, a spin-orbit-torque magnetoresistance effect element, a magnetic memory, and a high-frequency magnetic element which can efficiently generate a pure spin current and reduce a reversal current density can be provided.

DETAILED DESCRIPTION

Figure 1:
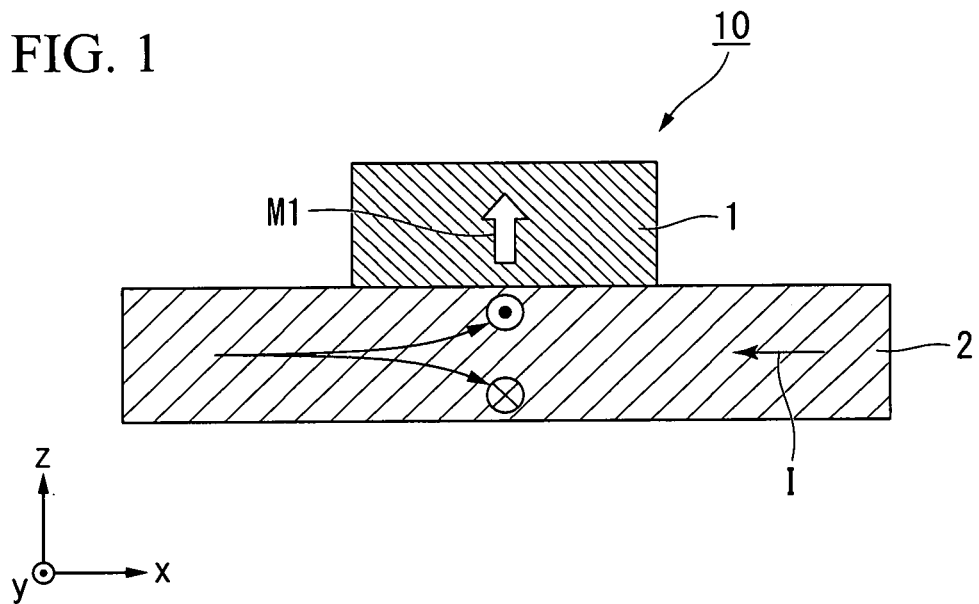
FIG. 1 is a schematic cross-sectional view of a spin current magnetization rotational element according to a first embodiment.

Hereinafter, the present embodiment will be described in detail with reference to the drawings. In the drawings used in the following description, in order to make the features easier to understand, characteristic portions may be illustrated in an enlarged manner for the sake of convenience, and the dimensional proportions of each constituent element may be different from the actual ones. The materials, dimensions, and the like exemplified in the following description are merely examples. The present disclosure is not limited thereto and can be realized by suitable changes within a range in which the effects of the present disclosure are exhibited.

First Embodiment

FIG. 1 is a schematic cross-sectional view of a spin current magnetization rotational element according to a first embodiment.

A spin current magnetization rotational element 10 according to the first embodiment includes a first ferromagnetic layer 1 and a spin-orbit torque wiring 2.

Here, in the following description, a first direction in which the spin-orbit torque wiring 2 extends is defined as an x direction, a lamination direction (second direction) of the first ferromagnetic layer 1 is defined as a z direction, a direction orthogonal to both of the x direction and the z direction is defined as a y direction.

<First Ferromagnetic Layer>

The first ferromagnetic layer 1 operates when orientation of its magnetization M1 changes. The first ferromagnetic layer 1 is a perpendicular magnetized film in which the magnetization M1 is oriented in the z direction in FIG. 1 but may be an in-plane magnetized film in which the magnetization M1 is oriented in an xy in-plane direction.

A ferromagnetic material, particularly a soft magnetic material, can be applied to the first ferromagnetic layer 1. For example, a metal selected from the group consisting of Cr, Mn, Co, Fe, and Ni, an alloy containing one or more of these metals, an alloy containing one or more of these metals and at least one element of B, C, and N, and the like can be used. Specifically, Co—Fe, Co—Fe—B, and Ni—Fe can be exemplified.

Also, in order to obtain a higher output, it is desirable to use a Heusler alloy such as $Co_2FeSi$. A Heusler alloy contains an intermetallic compound having a chemical composition represented by $X_2YZ$, where X is a transition metal element or a noble metal element from the Co, Fe, Ni, or Cu group in the periodic table, Y is a transition metal from the Mn, V, Cr, or Ti group or an element of the X, and Z is a typical element from Group III to Group V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like may be exemplified.

<Spin-Orbit Torque Wiring>

The spin-orbit torque wiring 2 extends in the x-direction. The spin-orbit torque wiring 2 is connected to one surface of the first ferromagnetic layer 1 in the z-direction. The spin-orbit torque wiring 2 may be directly connected to the first ferromagnetic layer 1 or may be connected thereto with a different layer such as a cap layer interposed therebetween.

The spin-orbit torque wiring 2 is formed of a material in which a pure spin current is generated due to a spin Hall effect when a current flows. The material need only have a configuration in which a pure spin current is generated in the spin-orbit torque wiring 2. Therefore, the material is not limited to a material consisting of a single chemical element. The spin-orbit torque wiring 2 may be constituted of a portion formed of a material which easily generates a pure spin current and a portion formed of a material with which it is difficult for a pure spin current to be generated.

The spin Hall effect is a phenomenon in which a pure spin current is induced in a direction orthogonal to the orientation of a current based on a spin orbit interaction when a current flows in the material. A mechanism in which a pure spin current is generated due to the spin Hall effect will be described.

As illustrated in FIG. 1, when a potential difference occurs between both ends of the spin-orbit torque wiring 2 in the x direction, a current I flows in the x direction. When the current I flows, a first spin S1 oriented in a +y direction and a second spin S2 oriented in a −y direction are each bent in a direction which is orthogonal to a direction of the current I. An ordinary Hall effect and the spin Hall effect are in common with each other in that a motion (movement) direction of electric charge (electrons) causing a motion (movement) is bent. However, in the ordinary Hall effect, a charged particle causing a motion in a magnetic field receives a Lorentz force and the motion direction thereof is bent. In contrast, the spin Hall effect is significantly different therefrom in that the movement direction is bent when electrons move only (a current flows only) even if no magnetic field is present.

In a nonmagnetic material (material which is not a ferromagnetic material), the number of electrons of the first spin Si and the number of electrons of the second spin S2 are equal to each other. Accordingly, in the diagram, the number of electrons of the first spin Si oriented in an upward direction and the number of electrons of the second spin S2 oriented in a downward direction are equal to each other. Therefore, the current as a net flow of electric charge is zero. In particular, spin current which is not accompanied by a current is called a pure spin current.

When a current flows in a ferromagnetic material, the first spin S1 and the second spin S2 are bent in directions opposite to each other in the same manner. On the other hand, in a ferromagnetic material, any of the first spin Si and the second spin S2 is in a state where there is a greater amount thereof. As a result, this is different in that a net flow of electric charge is caused (a voltage is generated). Therefore, a material of the spin-orbit torque wiring 2 does not include a material constituted of only a ferromagnetic material.

Here, when a flow of electrons of the first spin S1 is expressed as $J_↑$, a flow of electrons of the second spin S2 is expressed as $J_↓$, and a spin current is expressed as $J_S$, the relationship therebetween is defined as $J_S=J_↑-J_↓$. In FIG. 1, $J_S$ as a pure spin current flows in the z-direction in the diagram. Here, $J_S$ is a flow of electrons in which the polarizability is 100%.

In FIG. 1, when a ferromagnetic material is brought into contact with the upper surface of the spin-orbit torque wiring 2, a pure spin current diffuses and flows into the ferromagnetic material. That is, a spin is injected into the first ferromagnetic layer 1.

The spin-orbit torque wiring 2 is made of any of a metal, an alloy, an intermetallic compound, a metal boride, a metal carbide, a metal silicide, and a metal phosphide which has a function of generating a pure spin current due to a spin Hall effect when a current flows and includes a crystalline structure having the function.

A main component of the spin-orbit torque wiring 2 is preferably a non-magnetic heavy metal. Here, a heavy metal is a metal having a specific gravity equal to or higher than that of yttrium. It is preferable that a nonmagnetic heavy metal be a nonmagnetic metal of a high atomic number, that is, the atomic number 39 or higher having d-electrons or f-electrons in the outermost shell. The reason for this is that such a nonmagnetic metal has significant spin orbit interaction causing the spin Hall effect.

Normally, when a current flows in a metal, all the electrons move in a direction opposite to that of the current regardless of the spin orientation thereof. In contrast, since a nonmagnetic metal of a high atomic number having d-electrons or f-electrons in the outermost shell has significant spin orbit interaction, a direction in which electrons move due to the spin Hall effect depends on the orientation of an electron spin, so that the pure spin current $J_S$ is easily generated.

Also, the spin-orbit torque wiring 2 may include at least one rare gas element of Ar, Kr, and Xe. A rare gas element permeates into a crystal lattice, distorts the crystal lattice, and induces irregularity in a crystalline structure. When a crystalline structure is irregular, space rotational symmetry of the spin-orbit torque wiring 2 collapses. The collapse of the space rotational symmetry causes an internal field in the spin-orbit torque wiring 2. This internal field promotes a spin Hall effect. Furthermore, since an atomic radius of a rare gas element is larger than those of other elements, the rare gas element serves as a scattering factor which inhibits a current flow. A current is an electron flow and electrons propagate spins. For this reason, a scattering factor of a current is a scattering factor of spin. In other words, a rare gas element inhibits a flow of spin in the x direction and promotes a spin Hall effect.

When a spin Hall effect is promoted, an amount of spin injected into the first ferromagnetic layer 1 increases. The spin injected into the first ferromagnetic layer 1 exerts a spin-orbit torque (SOT) on the magnetization M1 of the first ferromagnetic layer 1. In other words, when the spin-orbit torque wiring 2 includes at least one rare gas element of Ar, Kr, and Xe, a SOT can be effectively exerted on the magnetization M1 of the first ferromagnetic layer 1.

A molar ratio of a rare gas element is preferably 0.005% or more and 2.00% or less of a total molar ratio of elements constituting the spin-orbit torque wiring 2 and more preferably 1.00% or more and 2.00 or less. A molar ratio of a rare gas element can be calculated using an energy-dispersive X-ray spectroscopy (EDS) after observing a cross section through a transmission electron microscope (TEM). A wavelength resulting from each element from a spectrum measured by an EDS is separated and a molar ratio of each element is calculated from a peak intensity in each wavelength.

Also, the spin-orbit torque wiring 2 may include a magnetic metal. A magnetic metal is a ferromagnetic metal or an anti-ferromagnetic metal. When a non-magnetic metal contains a small amount of a magnetic metal, the magnetic metal serves as a scattering factor of spin. In other words, a spin orbit interaction increases and generation efficiency of a spin current with respect to a current flowing through the spin-orbit torque wiring 2 increases. A main component of the spin-orbit torque wiring 2 may be only an anti-ferromagnetic metal.

On the other hand, when an excessive amount of a magnetic metal to be added is increased, a generated pure spin current is scattered due to the added magnetic metal, and as a result, an action of reducing a spin current increases in some cases. For this reason, it is desirable that a molar ratio of a magnetic metal to be added be sufficiently smaller than a total molar ratio of elements constituting a spin-orbit torque wiring. For reference, a molar ratio of a magnetic metal to be added is preferably 3% or less.

Also, the spin-orbit torque wiring 2 may include a topological insulator. A main component of the spin-orbit torque wiring 2 may be a topological insulator. A topological insulator is a substance in which an inside of the substance is an insulator or a high-resistance substance but a metal state in which a surface is spin-polarized is generated. This substance has an internal magnetic field called a spin orbit interaction. Thus, a new topological phase appears due to an effect of a spin orbit interaction even when there is no external magnetic field. This is a topological insulator and it is possible to generate a pure spin current with high efficiency due to a strong spin orbit interaction and breakdown of rotational symmetry at an edge.

As topological insulators, for example, SnTe, $Bi_{1.5}Sb_{0.5}Te_{1.7}Se_{1.3}$, $T_1BiSe_2$, $Bi_2Te_3$, $(Bi_{1-x}Sb_x)_2Te_3$ and the like are desirable. These topological insulators can generate a spin current with high efficiency.

The spin current magnetization rotational element 10 may include constituent elements other than the first ferromagnetic layer 1 and the spin-orbit torque wiring 2. For example, a substrate or the like may be provided as a support body. A substrate preferably has excellent flatness and examples of a material of the substrate include Si, AlTiC, and the like. Furthermore, another layer may be provided between the first ferromagnetic layer 1 and the spin-orbit torque wiring 2. A thickness of the other layer between the first ferromagnetic layer 1 and the spin-orbit torque wiring 2 is preferably equal to or less than a spin diffusion length of a material constituting the other layer.

As described above, since the spin current magnetization rotational element 10 according to this embodiment includes a rare gas element, a SOT can be efficiently exerted on the magnetization M1 of the first ferromagnetic layer 1. In other words, a reversal current density required to reverse the magnetization M1 of the first ferromagnetic layer 1 can be reduced.

<Manufacturing Method>

An example of a method for manufacturing a spin current magnetization rotational element 10 will be described. First, a base layer of a spin-orbit torque wiring is laminated above a substrate (not shown). Examples of a lamination method include a known method such as a sputtering method and a chemical vapor deposition (CVD) method.

Subsequently, a rare gas element is implanted into the base layer of the spin-orbit torque wiring. The rare gas element can be implanted using, for example, a reverse sputtering method. A reverse sputtering method is a method in which ions normally implanted into a target side are implanted into a body to be film-formed by reversing a potential.

Subsequently, the base layer of the spin-orbit torque wiring containing the rare gas element is processed into the spin-orbit torque wiring using a technique such as photolithography. Moreover, the spin-orbit torque wiring is coated with an insulating layer to surround the periphery of the spin-orbit torque wiring. An oxide film, a nitride film, or the like can be used for the insulating layer.

Subsequently, surfaces of the insulating layer and the spin-orbit torque wiring are planarized by chemical mechanical polishing (CMP). Moreover, a base layer of a first ferromagnetic layer is laminated on the planarized surfaces. Finally, when the base layer of the first ferromagnetic layer is processed using a technique such as photolithography, a spin current magnetization rotational element is obtained.

Second Embodiment

Figure 2:
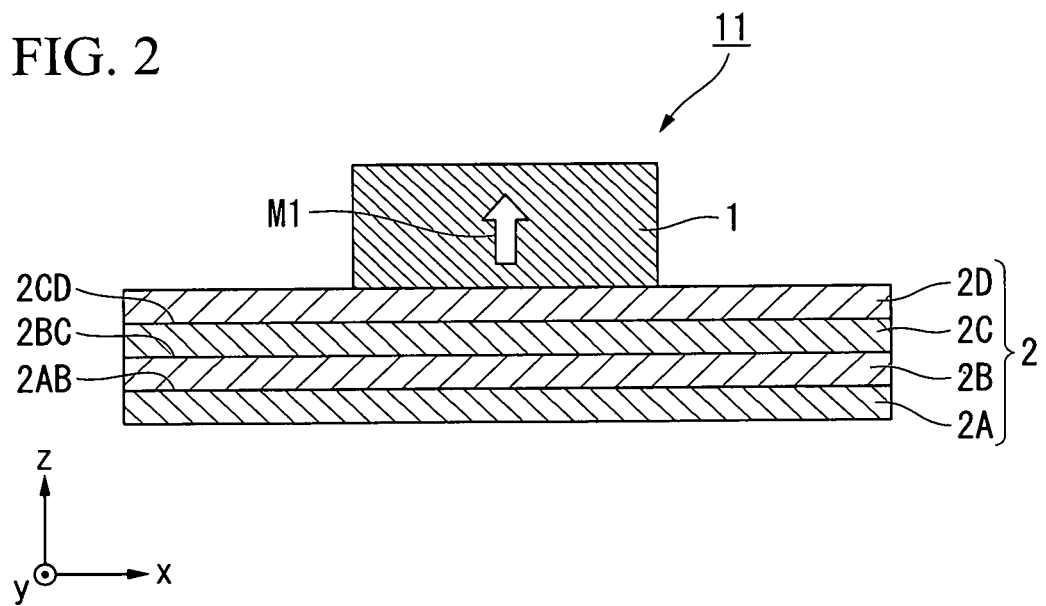
FIG. 2 is a schematic cross-sectional view of a spin current magnetization rotational element according to a second embodiment.

FIG. 2 is a schematic cross-sectional view of a spin current magnetization rotational element 11 according to a second embodiment. The spin current magnetization rotational element 11 according to the second embodiment and the spin current magnetization rotational element 10 according to the first embodiment differ in that a spin-orbit torque wiring 2 in the spin current magnetization rotational element 11 according to the second embodiment is constituted of a plurality of layers 2A, 2B, 2C, and 2D laminated in the z direction. Other constitutions thereof are the same as those of the spin current magnetization rotational element 10 according to the first embodiment and constituent elements that are the same as those of the spin current magnetization rotational element 10 according to the first embodiment will be denoted with the same reference numerals.

The spin-orbit torque wiring 2 illustrated in FIG. 2 includes the plurality of layers 2A, 2B, 2C, and 2D in the z direction. FIG. 2 illustrates four layers laminated in the z direction, but the number of layers to be laminated may be smaller or larger than 4. A spin accumulation (a state in which there are lots of one of upward spins and downward spins) occurs at interfaces between the plurality of layers 2A, 2B, 2C, and 2D due to an interfacial Rashba effect. Furthermore, the spin accumulation occurs on surfaces of the layers 2A and 2D due to an interfacial Rashba effect. The spin accumulation causes a pure spin current to occur.

A detailed mechanism of an interfacial Rashba effect is not clear, but it can be considered as follows. Space rotational symmetry is broken at an interface between different materials (including interfaces between the plurality of layers 2A, 2B, 2C, and 2D and the surfaces of the layers 2A and 2D) and thus a potential gradient is regarded to be present in a direction perpendicular to a plane. When a current flows along the interface at which there is the potential gradient in the direction perpendicular to the plane, that is, electrons move in a two-dimensional surface, an effective magnetic field acts on spin in an in-plane direction perpendicular to the movement direction of the electrons and orientation of the spin is aligned in a direction of the effective magnetic field. Thus, a spin accumulation is formed at the interface. Moreover, the spin accumulation causes a spin current diffusing outside of the plane.

The layers 2A, 2B, 2C, and 2D constituting the spin-orbit torque wiring 2 may be the same composition or different compositions. Furthermore, a rare gas concentration may be the same or different in the layers 2A, 2B, 2C, and 2D. Some examples in which portions having high rare gas concentrations are different will be described in detail below.

A first example is a case in which rare gas concentrations of interfaces 2AB, 2BC, and 2CD and the surfaces 2A1 and 2D1 in layers 2A, 2B, 2C, and 2D constituting the spin-orbit torque wiring 2 are high. Since an interfacial Rashba effect occurs at the interfaces 2AB, 2BC, and 2CD and the surfaces 2A1 and 2D1 in the layers 2A, 2B, 2C, and 2D, the effect can be significantly expressed when the rare gas concentrations of the interfaces 2AB, 2BC, and 2CD and the surfaces 2A1 and 2D1 are high. The rare gas concentrations of all of the surfaces of the interfaces 2AB, 2BC, and 2CD and the surfaces 2A1 and 2D1 need not be higher than those of the other portions. When the rare gas concentrations on any one of the interfaces 2AB, 2BC, and 2CD and the surfaces 2A1 and 2D1 are higher than those of the other portions, the interfacial Rashba effect can be greatly achieved as compared with the case in which the rare gas concentrations of the interfaces 2AB, 2BC, 2CD or the surfaces 2A1 and 2D1 are not higher than those of the other portions. Furthermore, the rare gas concentrations of the interfaces 2AB, 2BC, and 2CD increase when rare gas elements are implanted every time each of the layers 2A, 2B, 2C, and 2D and the surfaces 2A1 and 2D1 is laminated.

In the case of the first example, a distance between at least the interface 2CD (first interface) of the interfaces 2AB, 2BC, and 2CD on the first ferromagnetic layer 1 side and the first ferromagnetic layer 1 in the z direction is preferably shorter than a spin diffusion length of a material formed between the first ferromagnetic layer 1 and the interface (first interface) 2CD. With this constitution, a spin current generated at the interface (first interface) 2CD can efficiently reach the first ferromagnetic layer 1.

Also, a second example is a case in which a first additional layer (for example, 2D) is provided between a high-concentration layer (for example, 2C) in which a concentration of a rare gas element is the highest among layers any of 2A, 2B, 2C and 2D and a first ferromagnetic layer 1. A difference in concentration of rare gas elements in the layers 2A, 2B, 2C, and 2D can be freely set by adjusting times, intensities, and temperatures in which the rare gas elements are implanted.

The layer 2C containing the rare gas element of the high concentration is highly likely to have a distorted crystalline structure. When the first additional layer 2D having a small crystalline structure distortion is provided between the layer 2C and the first ferromagnetic layer 1, the layer 2D relaxes lattice mismatching between the first ferromagnetic layer 1 and the layer 2C containing the rare gas element of the high concentration. When the layer 2D is provided between the layer 2C and the first ferromagnetic layer 1, a crystallinity of the first ferromagnetic layer 1 can be enhanced and magnetic characteristics of the first ferromagnetic layer 1 can be enhanced.

In the case of the second example, a distance between the layer 2C containing the rare gas element of the high concentration and the first ferromagnetic layer 1 in the z direction is preferably shorter than a spin diffusion length of the layer 2D formed between the first ferromagnetic layer 1 and the layer 2C. With this constitution, a spin current generated in the layer 2C can efficiently reach the first ferromagnetic layer 1.

Also, in the case of the second example, as illustrated in FIG. 2, it is desirable to provide a second additional layers 2A and 2B on a side of the layer 2C containing the rare gas element of the high concentration opposite to the first ferromagnetic layer 1. The spin-orbit torque wiring 2 is generally laminated above a substrate. The layer 2C containing the rare gas element of the high concentration is highly likely to have a distorted crystalline structure and lattice mismatching between the layer 2C and the substrate occurs in some cases. In this case, adhesion between the substrate and the spin-orbit torque wiring 2 deteriorates. When the second additional layers 2A and 2B are provided between the layer 2C containing the rare gas element of the high concentration and the substrate, lattice mismatching can be relaxed and adhesion between the layer 2C and the substrate can increase.

A third example is a case in which a high-concentration layer (layer 2D) among layers any of 2A, 2B, 2C, and 2D in which a concentration of a rare gas element is the highest is located closest to a first ferromagnetic layer 1. The layer 2D containing the rare gas element of the high concentration has a high spin current generation efficiency. For this reason, when this layer 2D is provided closest to the first ferromagnetic layer 1, many spins can be efficiently injected into the first ferromagnetic layer 1.

The above-described first to third examples are examples of the spin current magnetization rotational element associated with this embodiment and these examples may be combined.

As described above, according to the spin current magnetization rotational element 11 associated with this embodiment, a large amount of spin current can occur due to an interfacial Rashba effect. For this reason, many spins can be injected into the first ferromagnetic layer 1 and magnetization M1 of the first ferromagnetic layer 1 can be reversed even at a small current density. Furthermore, when a position of a portion containing a rare gas element of a high concentration is changed, a spin current magnetization rotational element according to requested performance can be obtained.

Third Embodiment

Figure 3:
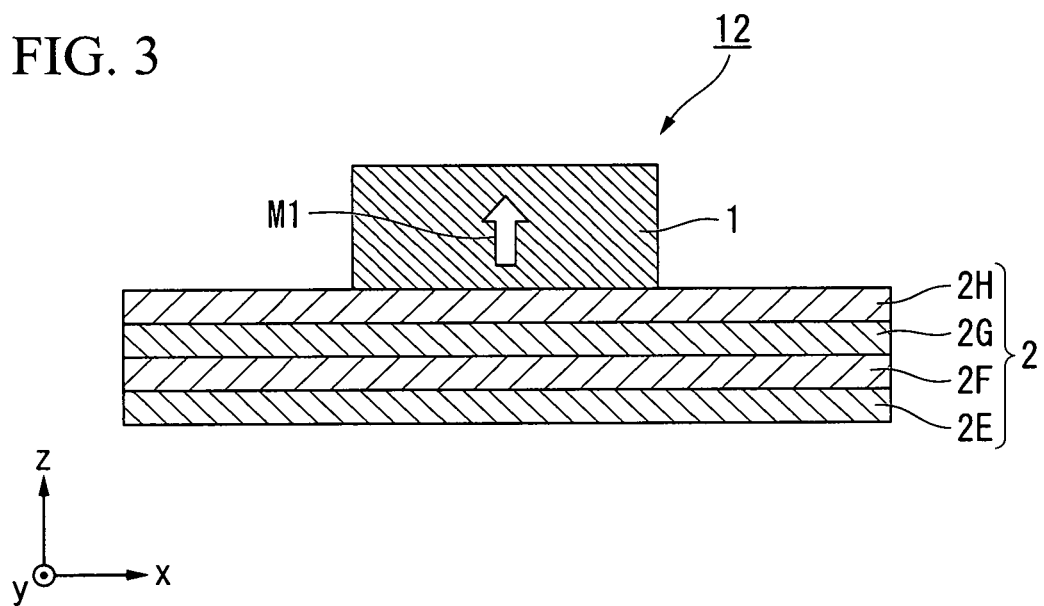
FIG. 3 is a schematic cross-sectional view of a spin current magnetization rotational element according to a third embodiment.

FIG. 3 is a schematic cross-sectional view of a spin current magnetization rotational element 12 according to a third embodiment. The spin current magnetization rotational element 12 according to the third embodiment and the spin current magnetization rotational element 10 according to the first embodiment differ in that, in the spin current magnetization rotational element 12 according to the third embodiment, a spin-orbit torque wiring 2 is constituted of a plurality of layers 2E, 2F, 2G, and 2H laminated in the z direction and spin resistances of layers 2E, 2F, 2G, and 2H are suppressed. Other constitutions thereof are the same as those of the spin current magnetization rotational element 10 according to the first embodiment and constituent elements that are the same as those of the spin current magnetization rotational element 10 according to the first embodiment will be denoted with the same reference numerals.

In the spin-orbit torque wiring 2 according to the third embodiment, spin resistance of a first layer of two arbitrary layers among the plurality of layers 2E, 2F, 2G, and 2H located on the first ferromagnetic layer 1 side is smaller than spin resistance of a second layer located away from the first ferromagnetic layer 1. In other words, the spin resistances are reduced in order of the layer 2H, the layer 2G, the layer 2F, and the layer 2E. It should be noted that FIG. 3 illustrates four layers laminated in the z direction, but the number of layers to be laminated may be smaller or larger than 4.

Spin resistance is a quantity which quantitatively indicates the ease of flow (difficulty of spin relaxation) of a spin current. Spin resistance Rs is defined by the following Expression (1). In Expression (1), $\lambda$ is a spin diffusion length of a material, $\rho$ is an electrical resistivity of the material, and A is a cross-sectional area of the material. For non-magnetic materials, when cross-sectional areas A are the same, a magnitude of spin resistance is determined in accordance with a value of $\rho\lambda$, which is a spin resistivity in Expression (1).

$$R_s \equiv \frac{\rho\lambda}{A} \tag{1}$$

Spin current reflection (return) occurs at an interface between substances having different spin resistances. In other words, only a part of a spin current is injected from a material having a small spin resistance into a material having a high spin resistance. As described above, in the spin-orbit torque wiring 2 according to the third embodiment, the spin resistances are reduced in order of the layer 2H, the layer 2G, the layer 2F, and the layer 2E. For this reason, spin currents generated in the layers 2E, 2F, 2G, and 2H can be effectively transferred to the first ferromagnetic layer 1 without being reflected.

Fourth Embodiment

<Spin-Orbit-Torque Magnetoresistance Effect Element>

Figure 4:
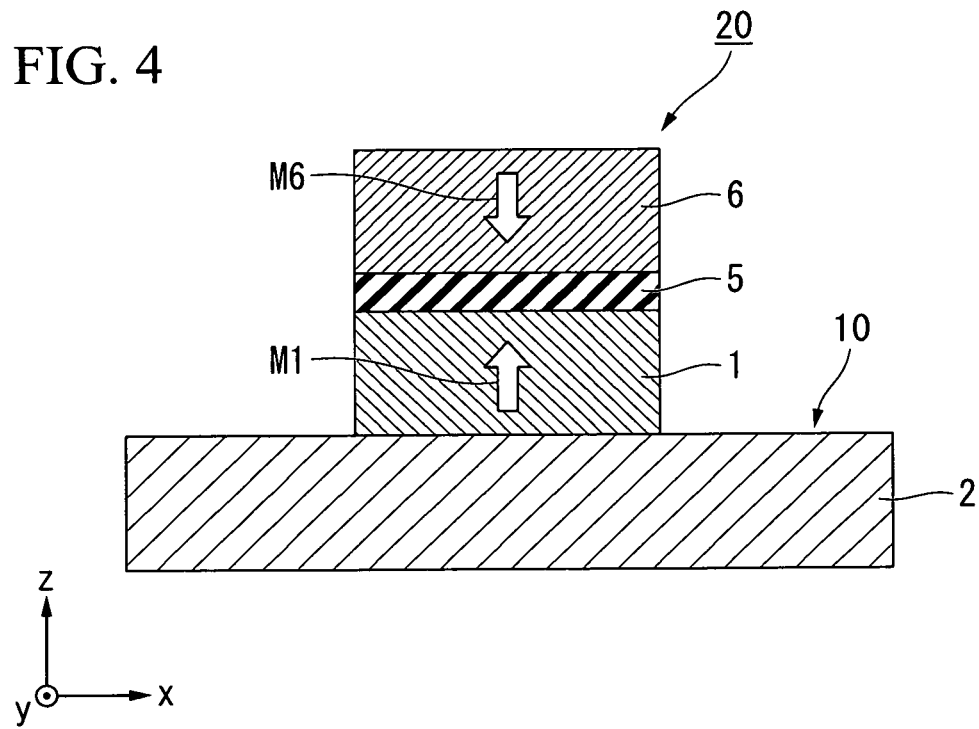
FIG. 4 is a schematic cross-sectional view of a spin-orbit-torque magnetoresistance effect element according to a fourth embodiment.

FIG. 4 is a schematic cross-sectional view of a spin-orbit-torque magnetoresistance effect element 20 according to a fourth embodiment. The spin-orbit-torque magnetoresistance effect element 20 illustrated in FIG. 4 includes a spin current magnetization rotational element 10, a non-magnetic layer 5, and a second ferromagnetic layer 6. Although the spin current magnetization rotational element 10 according to the first embodiment is used as a spin current magnetization rotational element in FIG. 4, the spin current magnetization rotational elements 11 and 12 according to the second embodiment and the third embodiment may be used. Description of a constitution that is the same as that of the spin current magnetization rotational element 10 in the first embodiment will be omitted.

A laminate (functional part) obtained by laminating a first ferromagnetic layer 1, the non-magnetic layer 5, and the second ferromagnetic layer 6 functions like in a normal magnetoresistance effect element. The functional part functions by magnetization M6 of the second ferromagnetic layer 6 fixed in one direction (z direction) and orientation of magnetization M1 of the first ferromagnetic layer 1 relatively changing. When the functional part is applied to a coercivity-differed type (pseudo spin valve type) magnetic random-access memory (MRAM), a coercivity of the second ferromagnetic layer 6 is larger than a coercivity of the first ferromagnetic layer 1. When the functional part is applied to an exchange bias type (spin valve type) MRAM, the magnetization M6 of the second ferromagnetic layer 6 is fixed by exchange-coupling with an anti-ferromagnetic layer.

Also, in the functional part, when the non-magnetic layer 5 is made of an insulator, the functional part has the same constitution as a tunneling magnetoresistance (TMR) element. In addition, when the non-magnetic layer 5 is made of a metal, the functional part has the same constitution as a giant magnetoresistance (GMR) element.

A known lamination constitution of a magnetoresistance effect element can be adopted as a lamination constitution of the functional part. For example, each layer may be constituted of a plurality of layers and other layers such as an anti-ferromagnetic layer for fixing a magnetization direction of the second ferromagnetic layer 6 may be provided. The second ferromagnetic layer 6 is referred to as a fixed layer or a reference layer and the first ferromagnetic layer 1 is referred to as a free layer, a memory layer, or the like.

A known material can be used as a material of the second ferromagnetic layer 6. Examples of the materials include a metal selected from the group consisting of Cr, Mn, Co, Fe, and Ni and a ferromagnetic alloy containing one or more of these metals. An alloy which contains one or more of these metals and at least one element from B, C, and N can also be used. To be specific, Co—Fe and Co—Fe—B may be exemplified.

Also, in order to obtain a higher output, it is desirable to use a Heusler alloy such as $Co_2FeSi$ as the material of the second ferromagnetic layer 6. A Heusler alloy contains an intermetallic compound having a chemical composition represented by $X_2YZ$, where X is a transition metal element or a noble metal element from the Co, Fe, Ni, or Cu groups in the periodic table, Y is a transition metal from the Mn, V, Cr, or Ti groups or an element of the X, and Z is a typical element from Group III to Group V. For example, $Co_2FeSi$, $Co_2MnSi$, $Co_2Mn_{1-a}Fe_aAl_bSi_{1-b}$, and the like may be exemplified.

In order to further increase a coercivity of the second ferromagnetic layer 6 with respect to the first ferromagnetic layer 1, an anti-ferromagnetic material such as IrMn and PtMn may be used as a material in contact with the second ferromagnetic layer 6. In addition, in order to prevent a leakage magnetic field of the second ferromagnetic layer 6 from affecting the first ferromagnetic layer 1, a synthetic ferromagnetic coupling structure may be adopted.

A known material can be used for the non-magnetic layer 5.

For example, when the non-magnetic layer 5 is made of an insulator (in the case of a tunnel barrier layer), $Al_2O_3$, $SiO_2$, MgO, $MgAl_2O_4$, and the like can be used as the material. Furthermore, materials obtained by substituting a part of Al, Si, and Mg among these materials with Zn, Be, or the like can also be used. Since MgO and $MgAl_2O_4$ among them are materials capable of realizing coherent tunneling, MgO and $MgAl_2O_4$ are desirable in that they can inject spins efficiently. When the non-magnetic layer 5 is made of a metal, Cu, Au, Ag, and the like can be used as the material.

The functional part may include other layers. For example, an underlayer may be provided on a surface of the first ferromagnetic layer 1 opposite to the non-magnetic layer 5 and a cap layer may be provided on a surface of the second ferromagnetic layer 6 opposite to the non-magnetic layer 5.

It is desirable that a layer arranged between the spin-orbit torque wiring 2 and the first ferromagnetic layer 1 not dissipate spins propagating from the spin-orbit torque wiring 2. For example, it is known that silver, copper, magnesium, aluminum, and the like have long spin diffusion lengths of 100 nm or more and it is difficult for them to dissipate spins.

Also, a thickness of this layer is preferably spin diffusion lengths or less of materials constituting the layer. When a thickness of the layer is spin diffusion lengths or less, spins propagating from the spin-orbit torque wiring 2 can be sufficiently transferred to the first ferromagnetic layer 1.

The spin-orbit-torque magnetoresistance effect element according to the fourth embodiment can perform recording or reading of data using a change in resistance value of the functional part occurring due to a difference in relative angles between the magnetization M1 of the first ferromagnetic layer 1 and the magnetization M6 of the second ferromagnetic layer 6. Since a pure spin current can be efficiently generated in the spin-orbit torque wiring 2 also in the spin-orbit-torque magnetoresistance effect element 20 according to the fourth embodiment, a reversal current density required to reverse the magnetization M1 of the first ferromagnetic layer 1 can be reduced.

Fifth Embodiment

<Magnetic Memory>

Figure 5:
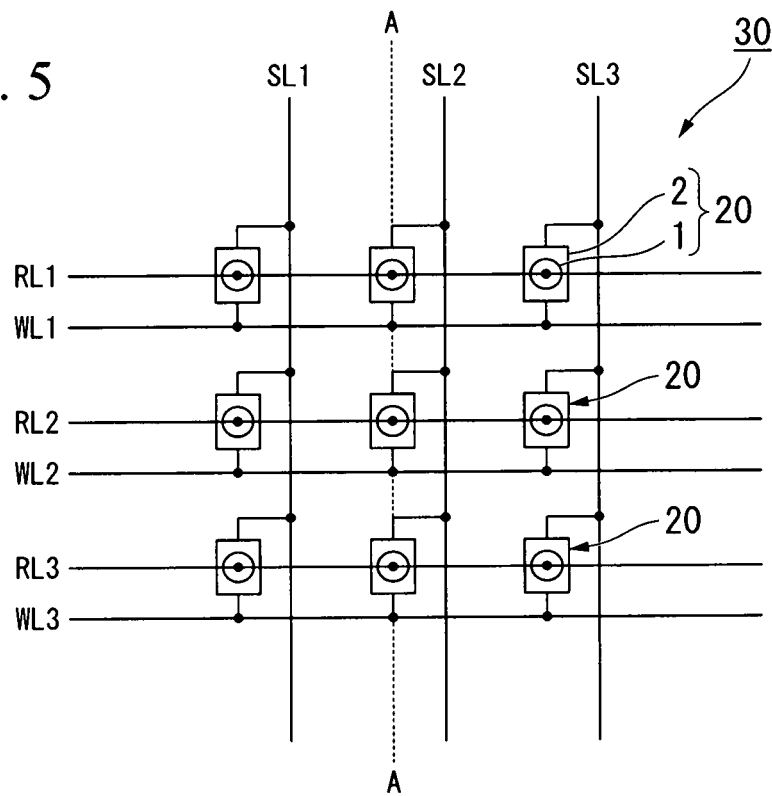
FIG. 5 is a diagram schematically showing a magnetic memory according to a fifth embodiment.

FIG. 5 is a plan view of a magnetic memory 30 including a plurality of spin-orbit-torque magnetoresistance effect elements 20 (refer to FIG. 4). FIG. 4 corresponds to a cross-sectional view of one of the spin-orbit-torque magnetoresistance effect elements 20 taken along line A-A in FIG. 5. In the magnetic memory 30 illustrated in FIG. 5, the spin-orbit-torque magnetoresistance effect elements 20 are arranged in a 3×3 matrix array. FIG. 5 is an example of a magnetic memory and the number and arrangement of spin-orbit-torque magnetoresistance effect elements 20 are arbitrary.

Each of the spin-orbit-torque magnetoresistance effect elements 20 is connected to one of word lines WL1 to WL3, one of source lines SL1 to SL3, and one of read lines RL1 to RL3.

A current flows to a spin-orbit torque wiring 2 of an arbitrary spin-orbit-torque magnetoresistance effect element 20 by selecting any of the word lines WL1 to WL3 and any of the source lines SL1 to SL3 to which the current is applied and a writing operation is performed. Furthermore, a current flows to an arbitrary spin-orbit-torque magnetoresistance effect element 20 in a lamination direction by selecting any of the read lines RL1 to RL3 and any of the source lines SL1 to SL3 to which the current is applied and a reading operation is performed. Any of the word lines WL1 to WL3, any of the source lines SL1 to SL3, and any of the read lines RL1 to RL3 to which a current is applied can be selected by a transistor or the like. In other words, the plurality of spin-orbit-torque magnetoresistance effect elements 20 can be utilized as a magnetic memory by reading data from an arbitrary element among the plurality of spin-orbit-torque magnetoresistance effect elements 20.

Sixth Embodiment

<High-Frequency Magnetic Element>

Figure 6:
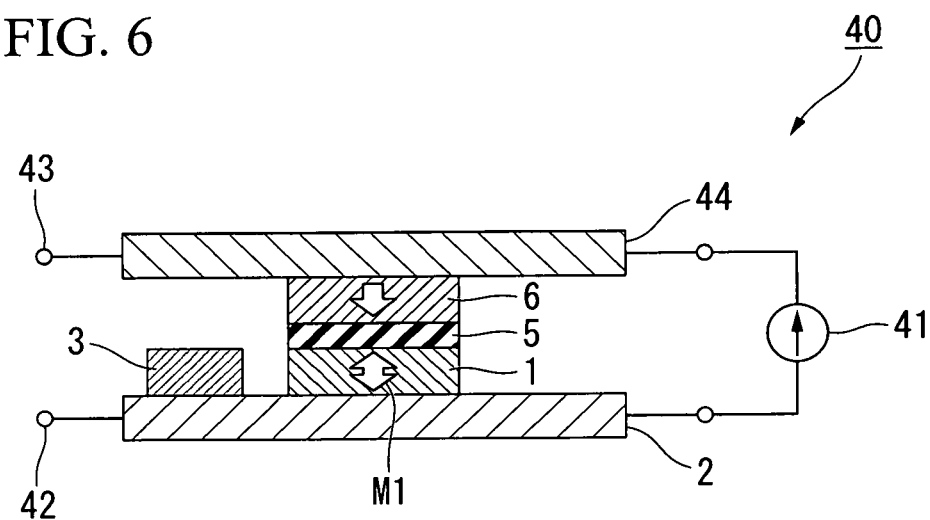
FIG. 6 is a schematic cross-sectional view of a high-frequency magnetic element according to a sixth embodiment.

FIG. 6 is a schematic cross-sectional view of a high-frequency magnetic element according to a sixth embodiment. A high-frequency magnetic element 40 illustrated in FIG. 6 includes the spin-orbit-torque magnetoresistance effect element 20 illustrated in FIG. 4 and a direct current (DC) power supply 41 connected to the spin-orbit-torque magnetoresistance effect element 20.

A high-frequency current is input through an input terminal 42 of the high-frequency magnetic element 40. A high-frequency current generates a high-frequency magnetic field. In addition, when a high-frequency current flows in the spin-orbit torque wiring 2, a pure spin current is induced, and a spin is injected into the first ferromagnetic layer 1. The magnetization M1 of the first ferromagnetic layer 1 vibrates due to a high-frequency magnetic field and an injected spin.

When a frequency of a high-frequency current input through the input terminal 42 is a ferromagnetic resonance frequency, the magnetization M1 of the first ferromagnetic layer 1 resonates in a ferromagnetic manner. When the magnetization M1 of the first ferromagnetic layer 1 resonates in a ferromagnetic manner, a change in resistance value of the functional part of a magnetoresistance effect increases. This change in resistance value is read through an output terminal 43 when the direct current power supply 41 applies a direct current or a direct voltage via an electrode 44.

That is, when a frequency of a signal input through the input terminal 42 is a ferromagnetic resonance frequency of the magnetization M1 of the first ferromagnetic layer 1, a change in resistance value output through the output terminal 43 increases. When the frequency is a frequency other than that, a change in resistance value output through the output terminal 43 decreases. The high-frequency magnetic element functions as a high-frequency filter by utilizing the degree of this change in resistance value.

While the preferred embodiments of the present disclosure have been described in detail above, the present disclosure is not limited to the specific embodiments. In addition, various modifications and changes are possible without departing from the gist of the present disclosure described in the claims.

EXAMPLES

Example 1

In Example 1, a spin current magnetization rotational element in which a spin-orbit torque wiring contains an Ar element was prepared. First, a target containing ruthenium (Ru) and tantalum (Ta) was prepared and a base layer of the spin-orbit torque wiring was laminated above a substrate by 5 nm using the target.

Subsequently, potentials of the target and a body to be film-formed were reversed and Ar ions were implanted into the body to be film-formed (reverse sputtering was performed). In this case, applied voltages and Ar flow rates had conditions such as (80 W, 40 sccm), (100 W, 60 sccm), (100 W, 80 sccm), (120 W, 100 sccm), and (120 W, 150 sccm). An amount of Ar ion to be implanted was adjusted by setting a milling rate by Ar ion implantation to 10 nm/h or less and adjusting each condition and an implantation time between 10 seconds and 600 seconds.

Figure 7:
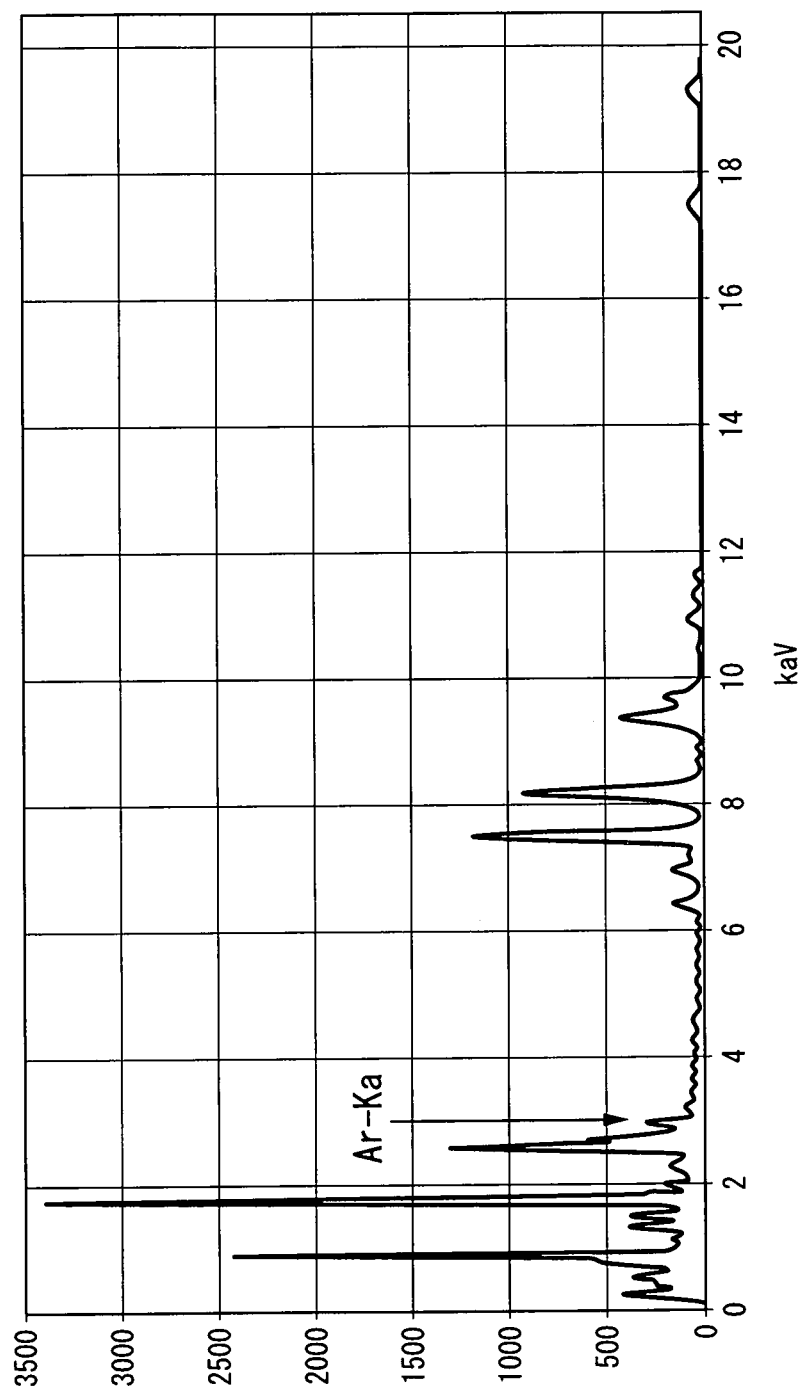
FIG. 7 is a diagram showing a result of analyzing a composition of a spin-orbit torque wiring in Example 1 using an energy-dispersive spectrometer (EDS).

Moreover, a composition of a layer after the Ar ion implantation was analyzed using an EDS. FIG. 7 illustrates results thereof. A molar ratio of each element was obtained from a peak intensity of a spectrum illustrated in FIG. 7. As a result, in a composition of the base layer of the spin-orbit torque wiring, Ar was 1.60 at % (error±0.07 at %), Ru was 94.21 at % (error±1.20 at %), and Ta was 4.19 at % (error±0.10 at %).

Then, the base layer of the spin-orbit torque wiring was processed in a shape of the spin-orbit torque wiring by photolithography. Moreover, the periphery thereof was coated with $SiN_x$, a surface thereof was subjected to CMP, and then a first ferromagnetic layer was laminated.

Figure 8:
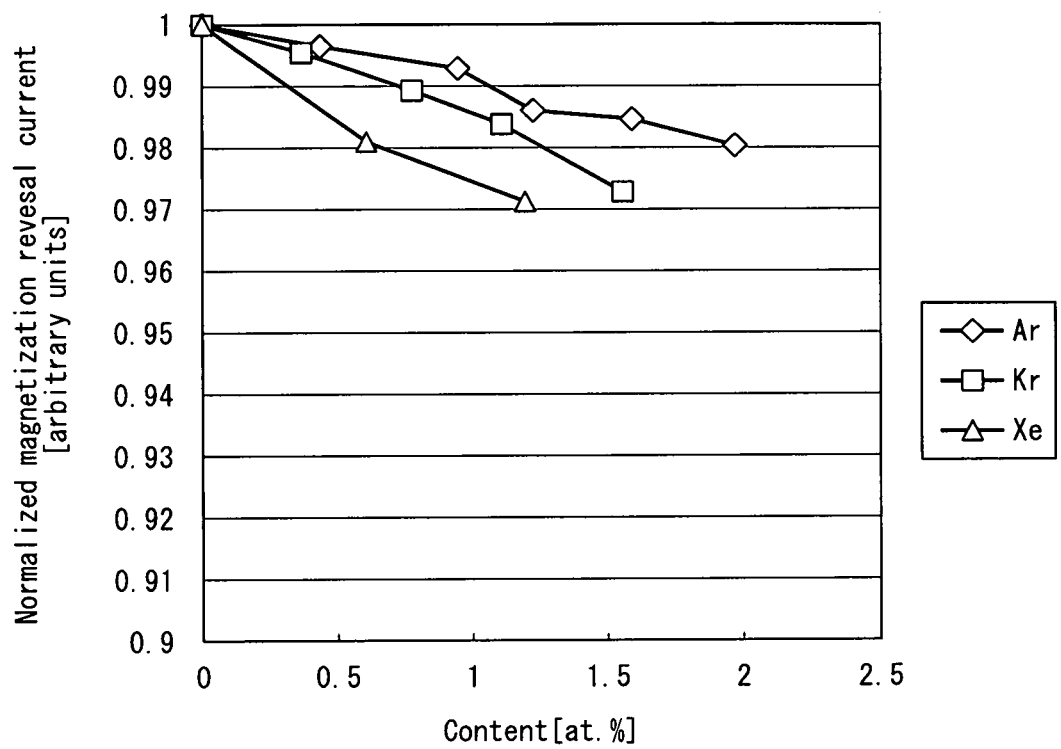
FIG. 8 is a diagram showing results of obtaining reversal current densities of spin current magnetization rotational elements in Examples 1 to 3.

Moreover, a reversal current density required to reverse magnetization of the first ferromagnetic layer was obtained. Furthermore, the same experiments were performed while changing molar ratios of Ar and the results are illustrated in FIG. 8. In FIG. 8, a horizontal axis is molar ratios of rare gas elements and a vertical axis is a reversal current density normalized in such a way that the case in which a rare gas element is not included corresponds to 1.

Example 2

Figure 9:
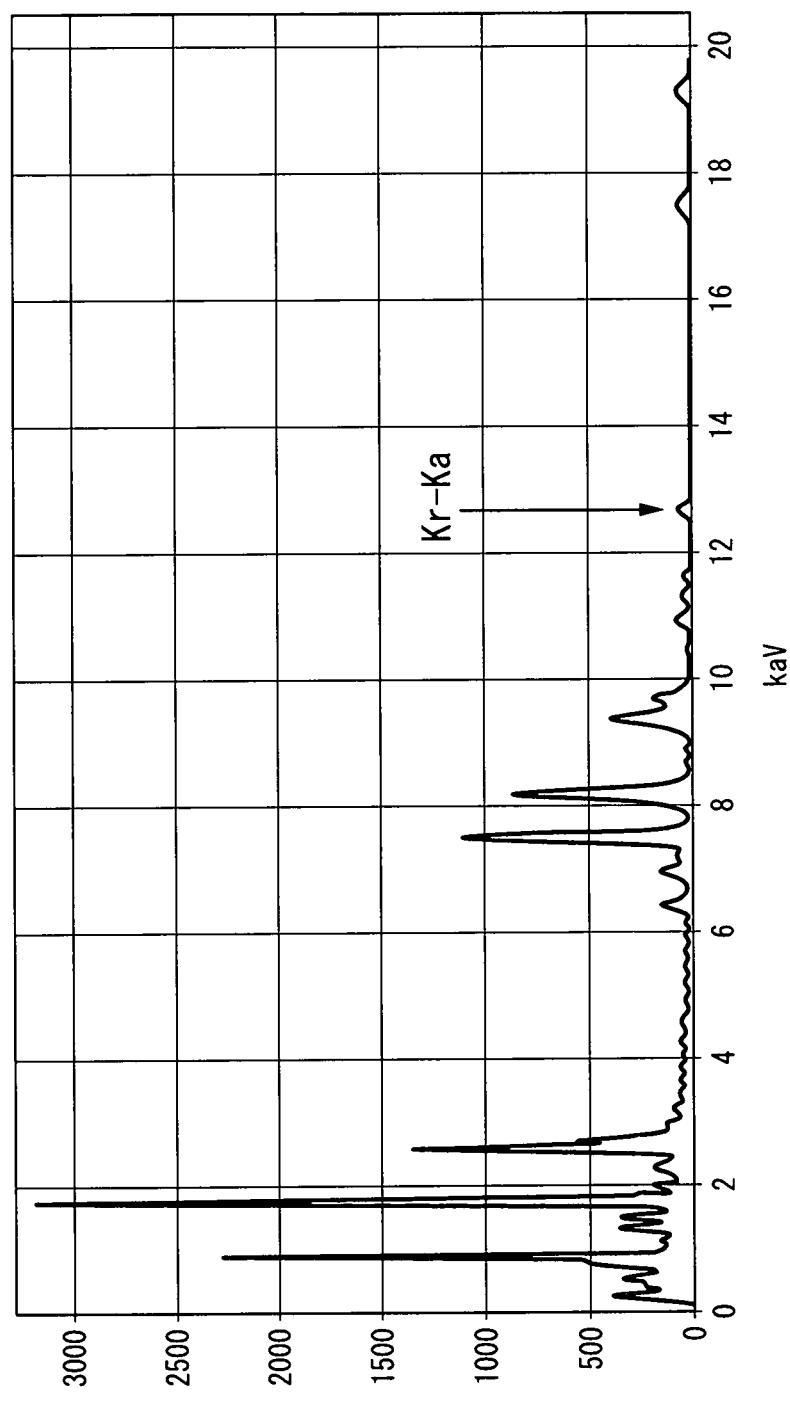
FIG. 9 is a diagram showing a result of analyzing a composition of a spin-orbit torque wiring in Example 2 using an EDS.

Example 2 and Example 1 differ in that a rare gas element is changed to a Kr element in Example 2. FIG. 9 is a diagram showing a result of analyzing a composition of a spin-orbit torque wiring in Example 2 using an EDS. In the composition of the spin-orbit torque wiring, Kr was 0.37 at % (error±0.06 at %), Ru was 95.79 at % (error±1.20 at %), and Ta was 3.85 at % (error±0.10 at %). Also in Example 2, a reversal current density required to reverse magnetization of a first ferromagnetic layer while changing a molar ratio of Kr was obtained. The results are illustrated in FIG. 8.

Example 3

Example 3 and Example 1 differ in that a rare gas element was changed to an Xe element in Example 3. Also in Example 3, a reversal current density required to reverse magnetization of a first ferromagnetic layer while changing a molar ratio of Xe was obtained. The results are illustrated in FIG. 8.

As illustrated in FIG. 8, in any of Ar, Kr, and Xe, the reversal current densities of the first ferromagnetic layers were reduced by adding the rare gas elements.

EXPLANATION OF REFERENCES

1 first ferromagnetic layer
2 spin-orbit torque wiring
2A, 2B, 2C, 2D, 2E, 2F, 2G, 2H layer
2AB, 2BC, 2CD interface
2A1, 2D1 surface
5 non-magnetic layer
6 second ferromagnetic layer
10, 11, 12 spin current magnetization rotational element
20 spin-orbit-torque magnetoresistance effect element
30 magnetic memory
40 high-frequency magnetic element
41 direct current (DC) power supply
42 input terminal
43 output terminal
44 electrode
M1, M6 magnetization

What is claimed is:

1. A spin current magnetization rotational element, comprising:
    a spin-orbit torque wiring extending in a first direction, a current flowing in the first direction; and
    a first ferromagnetic layer laminated in a second direction which intersects the first direction,
    wherein the spin-orbit torque wiring includes at least one rare gas element of Ar, Kr, and Xe.

2. The spin current magnetization rotational element according to claim 1, wherein a molar ratio of the rare gas element is 0.005% or more and 2.00% or less of a total molar ratio of elements constituting the spin-orbit torque wiring.

3. The spin current magnetization rotational element according to claim 1, wherein
    the spin-orbit torque wiring is constituted of a plurality of layers laminated in the second direction, and
    a concentration of the rare gas element is the highest at any one face among interfaces and surfaces of the plurality of layers.

4. The spin current magnetization rotational element according to claim 2, wherein
    the spin-orbit torque wiring is constituted of a plurality of layers laminated in the second direction, and
    a concentration of the rare gas element is the highest at any one face among interfaces and surfaces of the plurality of layers.

5. The spin current magnetization rotational element according to claim 1, wherein
    the spin-orbit torque wiring is constituted of the plurality of layers laminated in the second direction,
    the concentration of the rare gas element at a first interface closest to the first ferromagnetic layer among the interfaces of the plurality of layers is higher than the concentration of the rare gas element in a portion closer to the first ferromagnetic layer than the first interface in the spin-orbit torque wiring, and
    a distance between the first interface and the first ferromagnetic layer in the second direction is shorter than a spin diffusion length of a material formed between the first ferromagnetic layer and the first interface.

6. The spin current magnetization rotational element according to claim 2, wherein
    the spin-orbit torque wiring is constituted of the plurality of layers laminated in the second direction,
    the concentration of the rare gas element at a first interface closest to the first ferromagnetic layer among the interfaces of the plurality of layers is higher than the concentration of the rare gas element in a portion closer to the first ferromagnetic layer than the first interface in the spin-orbit torque wiring, and
    a distance between the first interface and the first ferromagnetic layer in the second direction is shorter than a spin diffusion length of a material formed between the first ferromagnetic layer and the first interface.

7. The spin current magnetization rotational element according to claim 3, wherein
    the spin-orbit torque wiring is constituted of the plurality of layers laminated in the second direction,
    the concentration of the rare gas element at a first interface closest to the first ferromagnetic layer among the interfaces of the plurality of layers is higher than the concentration of the rare gas element in a portion closer to the first ferromagnetic layer than the first interface in the spin-orbit torque wiring, and
    a distance between the first interface and the first ferromagnetic layer in the second direction is shorter than a spin diffusion length of a material formed between the first ferromagnetic layer and the first interface.

8. The spin current magnetization rotational element according to claim 4, wherein
    the spin-orbit torque wiring is constituted of the plurality of layers laminated in the second direction,
    the concentration of the rare gas element at a first interface closest to the first ferromagnetic layer among the interfaces of the plurality of layers is higher than the concentration of the rare gas element in a portion closer to the first ferromagnetic layer than the first interface in the spin-orbit torque wiring, and
    a distance between the first interface and the first ferromagnetic layer in the second direction is shorter than a spin diffusion length of a material formed between the first ferromagnetic layer and the first interface.

9. The spin current magnetization rotational element according to claim 1, wherein
    the spin-orbit torque wiring is constituted of a plurality of layers laminated in the second direction, and
    a first additional layer constituting the spin-orbit torque wiring is provided between a high-concentration layer in which a concentration of the rare gas element is the highest among the plurality of layers and the first ferromagnetic layer.

10. The spin current magnetization rotational element according to claim 9, wherein a distance between the first ferromagnetic layer and the high-concentration layer in the second direction is shorter than a spin diffusion length of a material formed between the first ferromagnetic layer and the high-concentration layer.

11. The spin current magnetization rotational element according to claim 9, wherein a second additional layer constituting the spin-orbit torque wiring is provided on a side of the high-concentration layer opposite to the first ferromagnetic layer.

12. The spin current magnetization rotational element according to claim 1, wherein
the spin-orbit torque wiring is constituted of a plurality of layers laminated in the second direction, and
a high-concentration layer in which a concentration of the rare gas element is the highest among the plurality of layers is located closest to the first ferromagnetic layer.

13. The spin current magnetization rotational element according to claim 1, wherein
the spin-orbit torque wiring is constituted of a plurality of layers laminated in the second direction, and
spin resistance of a first layer located on the first ferromagnetic layer side in two arbitrary layers among the plurality of layers is smaller than spin resistance of a second layer located away from the first ferromagnetic layer.

14. A spin-orbit-torque magnetoresistance effect element, comprising:
the spin current magnetization rotational element according to claim 1;
a nonmagnetic layer which is laminated on a surface on a side opposite to a surface in contact with the spin-orbit torque wiring in the first ferromagnetic layer; and
a second ferromagnetic layer, the nonmagnetic layer being sandwiched between the second ferromagnetic layer and the first ferromagnetic layer.

15. A magnetic memory, comprising:
a plurality of spin-orbit-torque magnetoresistance effect elements according to claim 14.

16. A high-frequency magnetic element, comprising:
the spin-orbit-torque magnetoresistance effect element according to claim 14.

* * * * *